(12) United States Patent
Zhu et al.

(10) Patent No.: US 8,878,280 B2
(45) Date of Patent: Nov. 4, 2014

(54) FLASH MEMORY DEVICE AND METHOD FOR MANUFACTURING THE SAME

(75) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 283 days.

(21) Appl. No.: 13/148,265

(22) PCT Filed: Feb. 24, 2011

(86) PCT No.: PCT/CN2011/071248
§ 371 (c)(1),
(2), (4) Date: Aug. 5, 2011

(87) PCT Pub. No.: WO2012/041035
PCT Pub. Date: Apr. 5, 2012

(65) Prior Publication Data
US 2012/0112261 A1    May 10, 2012

(30) Foreign Application Priority Data
Sep. 28, 2010  (CN) .......................... 2010 1 0296053

(51) Int. Cl.
*H01L 29/788* (2006.01)
*H01L 27/115* (2006.01)
*H01L 29/66* (2006.01)
*H01L 21/84* (2006.01)
*H01L 27/12* (2006.01)

(52) U.S. Cl.
CPC ...... *H01L 27/1211* (2013.01); *H01L 27/11521* (2013.01); *H01L 29/66825* (2013.01); *H01L 29/66803* (2013.01); *H01L 29/7881* (2013.01); *H01L 21/845* (2013.01)
USPC ............................ 257/316; 257/329; 438/257

(58) Field of Classification Search
None
See application file for complete search history.

(56) References Cited

U.S. PATENT DOCUMENTS

| | | | |
|---|---|---|---|
| 6,413,802 B1 * | 7/2002 | Hu et al. | 438/151 |
| 7,394,116 B2 | 7/2008 | Kim et al. | |
| 7,560,344 B2 | 7/2009 | Kim et al. | |
| 7,679,139 B2 | 3/2010 | Larsen et al. | |
| 7,754,546 B2 * | 7/2010 | Kobayashi | 438/157 |
| 7,777,275 B2 | 8/2010 | Lee | |
| 8,716,803 B2 * | 5/2014 | Wang | 257/365 |
| 2005/0260814 A1 * | 11/2005 | Cho et al. | 438/257 |
| 2005/0285204 A1 | 12/2005 | Kim et al. | |
| 2006/0044915 A1 * | 3/2006 | Park et al. | 365/222 |

(Continued)

FOREIGN PATENT DOCUMENTS

| | | |
|---|---|---|
| CN | 101075573 A | 11/2007 |
| CN | 101183678 A | 5/2008 |

*Primary Examiner* — Andres Munoz
(74) *Attorney, Agent, or Firm* — Goodwin Procter LLP

(57) ABSTRACT

The present invention provides a FinFET flash memory device and the method for manufacturing the same. The flash memory device is on an insulating layer, comprising: a first fin and a second fin, wherein the second fin is a control gate of the device; a gate dielectric layer, at side walls and top of the first fin and the second fin; source/drain regions, inside the first fin at both sides of a floating gate.

13 Claims, 5 Drawing Sheets

(56) References Cited

U.S. PATENT DOCUMENTS

| | | | |
|---|---|---|---|
| 2007/0018201 A1* | 1/2007 | Specht et al. | 257/204 |
| 2007/0267695 A1 | 11/2007 | Lee | |
| 2008/0111199 A1 | 5/2008 | Kim et al. | |
| 2008/0203462 A1* | 8/2008 | Goarin | 257/316 |
| 2009/0065866 A1 | 3/2009 | Larsen et al. | |
| 2009/0078997 A1* | 3/2009 | Greene et al. | 257/347 |
| 2009/0124069 A1* | 5/2009 | Clark et al. | 438/525 |
| 2010/0320525 A1* | 12/2010 | Nagashima et al. | 257/324 |

\* cited by examiner

FLASH MEMORY DEVICE AND METHOD FOR MANUFACTURING THE SAME

CROSS REFERENCE TO RELATED APPLICATIONS

The present application is a National Phase application of, and claims priority to, PCT Application No. PCT/CN2011/071248, filed on Feb. 24, 2011, entitled "Flash Memory Device And Method For Manufacturing The Same," which claims the priority of Chinese Patent Application No. 201010296053.4, filed on Sep. 28, 2010. Both the PCT Application and the Chinese Application are incorporated herein by reference in their entireties.

FIELD OF THE INVENTION

The present invention relates to semiconductor manufacturing technology, and particularly to a flash memory device with a FinFET structure and a method for manufacturing the same.

BACKGROUND OF THE INVENTION

With the continuous increasing of the scale for the integrated circuits and the reduction of the size for devices, three-dimensional device has become the direction of semiconductor industry in the future development. Devices with FinFET structures have received many concerns for their excellent cut-off performance, extendibility, and compatibility with conventional manufacturing technology.

Fin structure has also been introduced into flash memory devices in the development of semiconductor technology currently. A flash memory device is a device to write and erase data electrically, and has two capacitors connected in series achieved by forming dielectric layers which form between a control gate, a floating gate, and a substrate. Those capacitors enable the floating gate to keep charges even when the electricity supply is cut off.

However, it remains impossible for the current process of the Fin-type flash memory device to compatible with FinFET logic device.

SUMMARY OF THE INVENTION

The objection of the present invention is to provide a solution to resolve at least one of the technical defects mentioned above, especially to provide a FinFET flash memory device which is compatible with FinFET device, and the manufacturing technology of the device, and at the same time, reduce the cost of manufacturing through the new method.

In order to achieve this objective, the present invention will provide a flash memory device which is on an insulating layer. It comprises: a first fin and a second fin, wherein the second fin is a control gate of the device. A dielectric layer is at side walls and top of the first fin and the second fin. A floating gate is on the dielectric layer and across the first fin and the second fin. Source/drain regions are located within the first fin which is at both sides of the floating gate.

On the other hand, the present invention provides a method to manufacture a certain kind of flash memory device. The method comprises: providing a substrate including an insulating layer and a semiconductor layer, the semiconductor layer being on the insulating layer; patterning the semiconductor layer so as to form a first fin and a second fin; forming a gate dielectric layer at side walls and top of the first fin and the second fin; forming a floating gate across the first fin and the second fin on the gate dielectric layer; forming source/drain regions inside the first fin which is at both sides of the floating gate.

Complete compatibility in the manufacturing technique between the FinFET flash memory device and the FinFET logical device can be achieved as well as cost-down in its manufacturing by using the FinFET flash device and the method for manufacturing the same given by the present invention.

BRIEF DESCRIPTION OF THE DRAWINGS

The above-mentioned and other objectives, features and advantages of the present invention will become clearer through the description with reference to the attached drawings. The attached drawings are not drawn to scale for disclosing the purport of the present invention.

DETAILED DESCRIPTION OF THE EMBODIMENTS

Hereunder, the present invention will be described in detail with reference to embodiments, in conjunction with the accompanying drawings.

The following disclosure will provide various embodiments or examples implementing different structure of the present invention. In order for simplification of the disclosure, devices and configurations in certain examples will be described in the following. Of course, they are only illustrative rather than limiting the present invention. In addition, figures and/or letters can be repeated in different embodiments for the purpose of simplification and clearness. However, such repetition does not indicate the relationship among various embodiments and/or configurations. Moreover, the present invention provides various examples of specific techniques and materials, but any skilled person in the art can be aware of the applicability of other techniques and/or the usage of other materials. In addition, the following description of the structure wherein the first feature is on the second feature can comprise the embodiment where the first feature contacts the second feature directly, and can further comprise the embodiment where a further feature is formed between the first feature and the second feature directly. In this case, the first feature may not contact the second feature directly.

Figure 1:
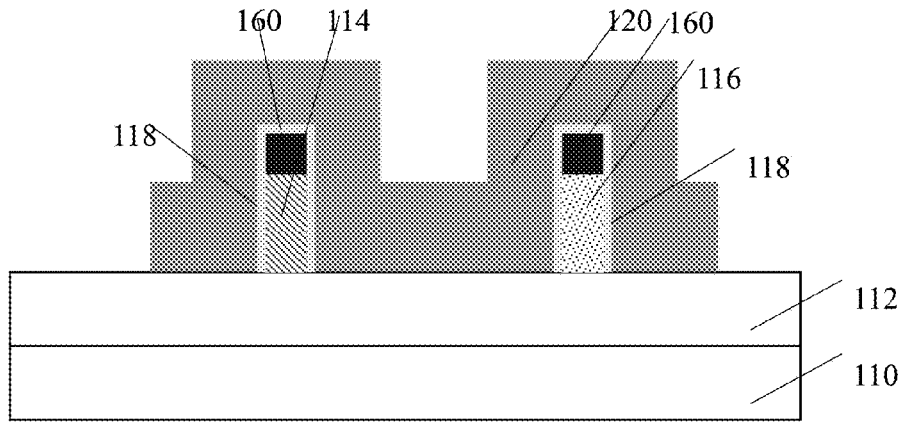
FIG. 1 is a structural schematic view of a FinFET flash memory device according to an embodiment of the present invention.

FIG. 1 is a structural schematic view of the FinFET flash memory device according to an embodiment of the present invention. The FinFET flash memory device is formed on an insulating substrate. The insulating substrate comprises an insulating layer 112 and a semiconductor layer 110. The insulating layer 112 is located on the semiconductor layer 110. Any semiconductor on insulator (SOD can be used as the material of the substrate practically. In the present invention, a silicon-on-insulator (SOI) substrate is used, for example, in the embodiment. Specifically, the semiconductor layer 110 is a silicon layer of the SOI and the insulating layer 112 is a buried oxide layer (BOX, such as $SiO_2$) of the SOI. A silicon layer on the BOX can form a fin directly, which is a silicon fin.

The FinFET flash memory device comprises: a first fin 114 and a second fin 116 formed on the insulating substrate, wherein the first fin 114 is a flash memory channel, and the second fin 116 is a control gate; a gate dielectric layer 118 formed on sidewalls and on top of the first fin 114 and the second fin 116; a floating gate 120 formed on the substrate 110 and across the first fin 114 and the second fin 116; and source/drain regions formed at both sides of the first fin 114. The source/drain regions are not shown in FIG. 1.

The FinFET flash memory device can further comprise protective cap layers 160 formed on top of the silicon layers of the first fin 114 and the second fin 116. Preferably, the device can further comprise spacers 122 formed at both sides of the floating gate. The spacers 122 are not shown in FIG. 1.

The second fin 116 can be n-type or p-type doped. Preferably, the second fin 116 is n-type doped in the embodiment. For example, ions of P or As may be used as the dopants. It is more advantageous for n-type doping configuration to control the conductivity of the gate.

The floating gate 120 can be a metal gate or a polysilicon gate.

Preferably, the first fin 114 and the second fin 116 are placed in parallel on the insulating layer 112.

The method for manufacturing the flash memory device shown in FIG. 1 will be described in detail with attached drawings. Of course, steps and techniques that differ from what will be described are also alternatives, and are all fall within the scope of the present invention.

Figure 2:
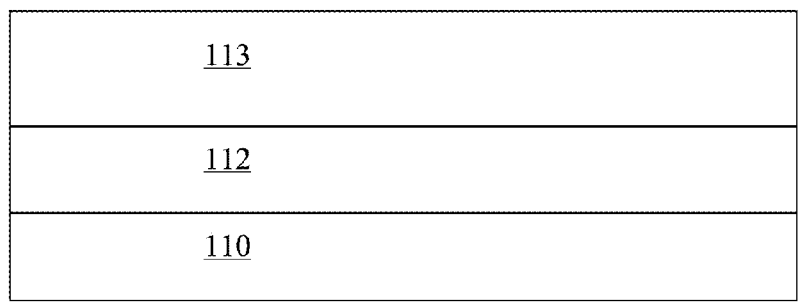
FIGS. 2-9 are schematic views of intermediate structures in a method for manufacturing a flash memory device according to an embodiment of the present invention.

In step 301, a substrate is provided, as shown in FIG. 2. The substrate comprises an insulating layer 112 and a semiconductor layer 113, wherein the semiconductor layer 113 is located on the insulating layer 112. The substrate can be made of any conventional semiconductor material or insulating material. A SOI substrate can be used in practice. Preferably, in the embodiment of the present invention, a SOI substrate is used. The SOI substrate comprises a bottom silicon layer 110, an intermediate buried oxide (BOX, such as SiO2) layer 112 and a top silicon layer 113, which form a Si/SiO$_2$/Si stacked layer as shown in FIG. 2.

Figure 3:
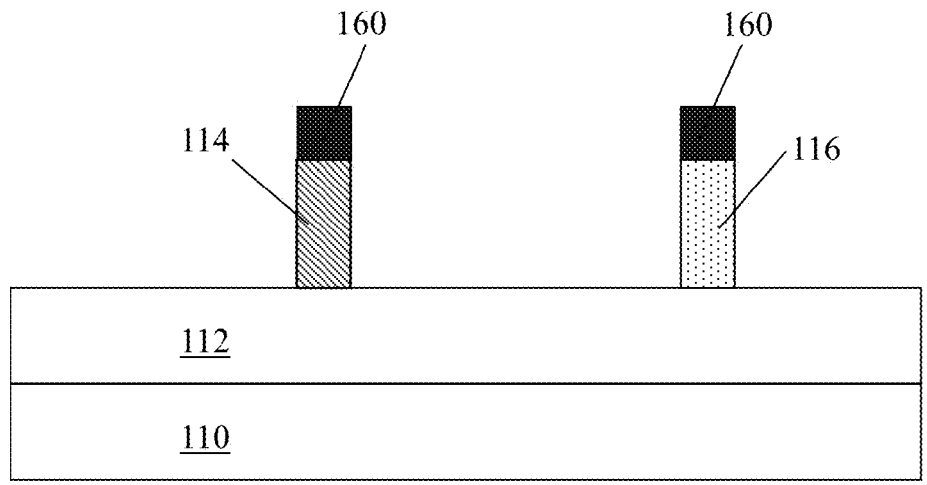

In step 302, the silicon layer 113 is patterned to form a first fin 114 and a second fin 116, wherein the first fin 114 is the channel of the FinFET flash memory device, and the second fin 116 is a control gate of the device. Optionally, a protective cap layer 160 can be formed on the first fin 114 and the second fin 116. Specifically, a protective layer is firstly formed on the silicon layer 113, wherein the protective layer can be formed through a conventional deposition process such as a physical vapor deposition (PVD) method, a chemical vapor deposition (CVD) method, an atomic layer deposition (ALD) method, or a sputtering method and the like, and the protective layer is made of one or more of insulating materials such as Si$_3$N$_4$, SiO$_2$, SiOF, SiCOH, SiO, SiCO, SiCON, SiON and etc. Then a patterning process is performed (not shown in drawings), for example, by spinning photoresist, exposure, developing and etching, such as reactive ion etching (RIE), so as to form the protective layer and the silicon layer 113 having a pattern corresponding to the first fin 114 and the second fin 116 which are to be formed, and the etching stops at the BOX layer 112. Then the photoresist is removed, and the first fin 114 and the second fin 116 shown in FIG.3 are formed after the silicon layer is etched. The protective layer is etched to form the protective cap layer 160 on the first fin 114 and the second fin 116.

Figure 4:
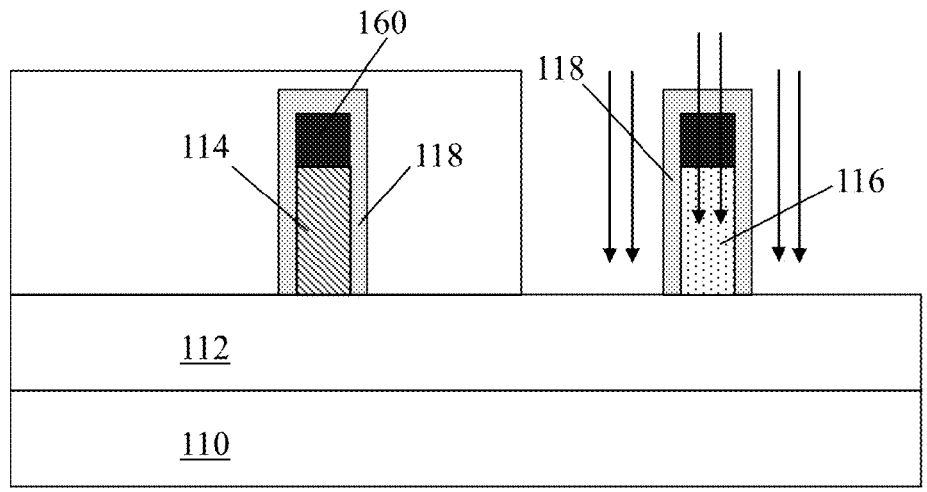

In step 303, a gate dielectric layer 118 is formed on sidewalls and on top of the first fin 114 and the second fin 116, as shown in FIG. 4. The dielectric layer 118 is deposited on the device as shown in FIG. 4. The dielectric layer 118 has a thickness within the range of about 2-15 nm. The gate dielectric layer 118 can be made of silicon oxide, silicon oxynitride or high-K materials. The high-K materials can be hafnium-based materials such as hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO) or any combination thereof and/or other appropriate materials. The gate dielectric layer 118 can be formed by a thermal oxidation, CVD method, an ALD method and the like. The methods mentioned are only illustrative rather than limiting the present invention.

Then, an etching process is further performed to the gate dielectric layer 118. Specifically, a RIE method is adopted to perform the etching process, and the etching process is stopped at the BOX layer 112.

Figure 5:
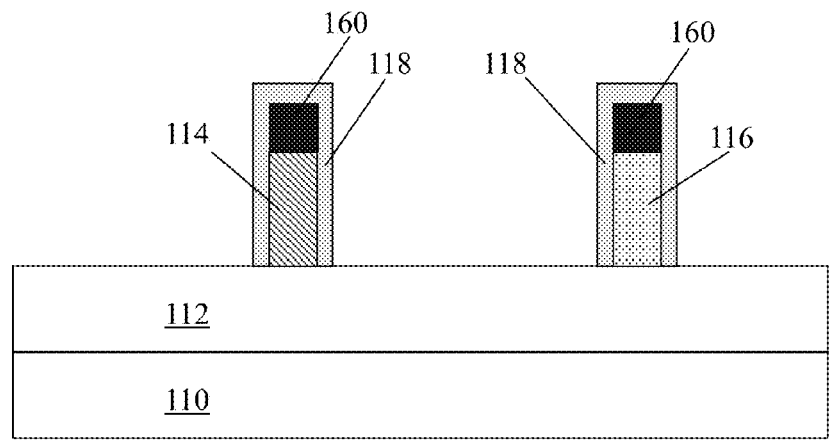

Optionally, the second fin 116 is n-type or p-type doped, preferably n-type doped, since it is beneficial for activating the conduction of the control gate. In the embodiment of the present invention, the second fin 116 is n-type doped. Specifically, an ion implantation is performed, which can be As or P ions, or a combination thereof, to the second fin 116, after the first fin 114 is covered with a mask, as shown in FIG. 4. Then the mask covering the first fin 114 is removed and the device shown in FIG. 5 is formed. The second fin 116 is a control gate of the device, and the first fin 114 is the channel of the device.

Figure 6:
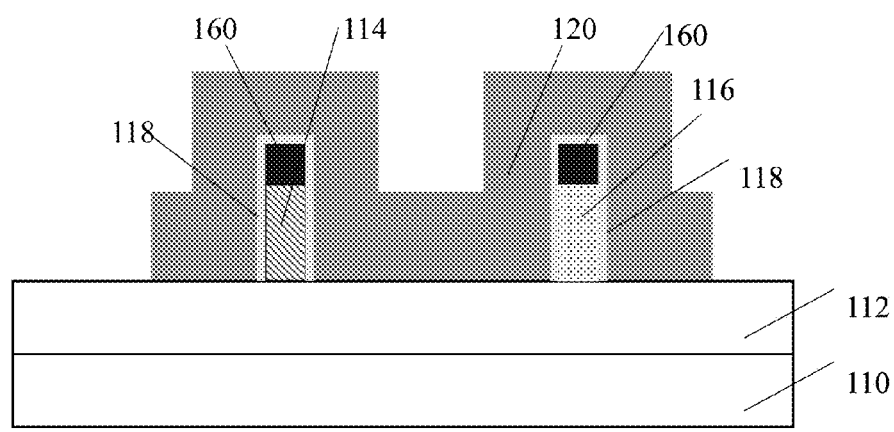

In step 304, a floating gate 120 is formed on the gate dielectric layer 118 across the first fin 114 and the second fin 116. The floating gate 120 can be a metal gate or a polysilicon silicon gate, and a polysilicon gate is used in the embodiment of the present invention. After depositing a polysilicon layer on the device shown in FIG. 5, the device is patterned, for example, by lithography and RIE to form the floating gate 120 shown in FIG. 6. In the embodiment, the polysilicon layer may be formed by methods such as ALD, CVD, high-density plasma chemical vapor deposition (HDPCVD), sputtering and other appropriate methods. The methods mentioned above are only illustrative rather than limiting the present invention.

Figure 7:
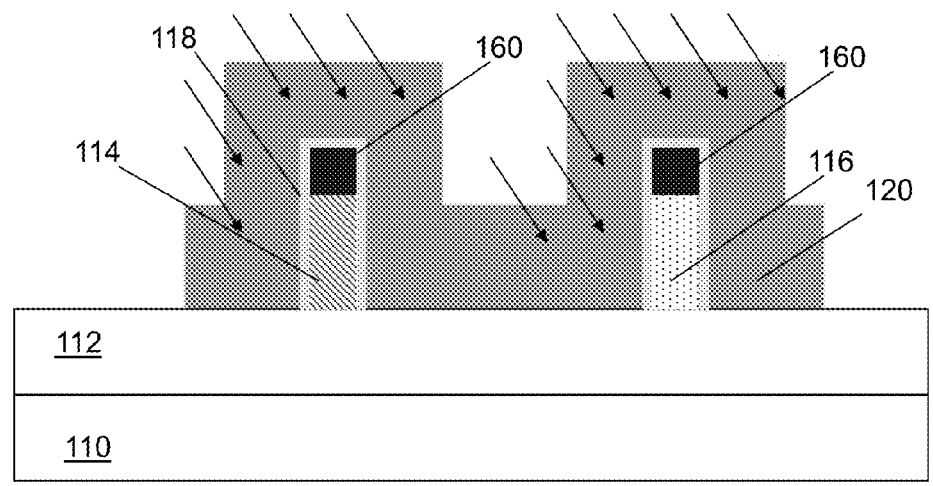

Optionally, a halo implantation and/or source/drain extension implantation may be performed to the first fin 114. For example, p-type dopants such as B, BF, or a combination thereof can be used to perform the tilt angle implantation in order to form a halo implantation region; and n-type dopants such as As, P, or a combination thereof can be used to form the source/drain extension regions, as shown in FIG. 7.

Figure 8:
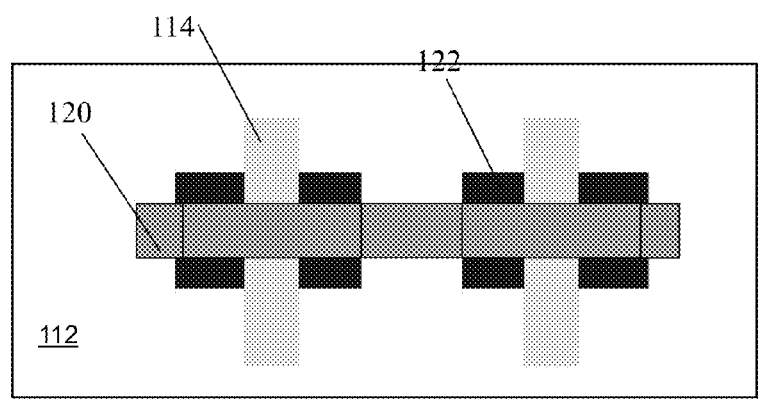

Optionally, spacers 122 may be formed on both sides of the floating gate 120, as shown in FIG. 8 (top view). The spacers 122 can be made of silicon nitride, silicon oxide, silicon oxynitride, silicon carbide, fluorine-doped silica glass, low-K dielectric materials, or any combination thereof, and/or other appropriate materials. The spacers 122 may have a multi-layer structure. Methods including ALD, plasma enhanced chemical vapor deposition (PECVD) or other appropriate methods may be used to deposit appropriate dielectric materials and, together with etching (RIE, for example), to form the spacers 122. The spacers 122 may have a thickness within the range of about 20-60 nm.

In step 305, source/drain regions may be formed within the first fin 114 which is located on both sides of the floating gate 120. For example, a tilt angle implantation can be performed to the portion of the first fin 114 where it is not uncovered by the floating gate 120, and then an annealing process is performed to activate the dopants in order to form the source/drain regions. N-type dopants such as As, P, or a combination thereof can be used for the nMOSFET; while p-type dopants such B, BF$_2$, In, or any combination thereof can be used for the pMOSFET.

Figure 9:
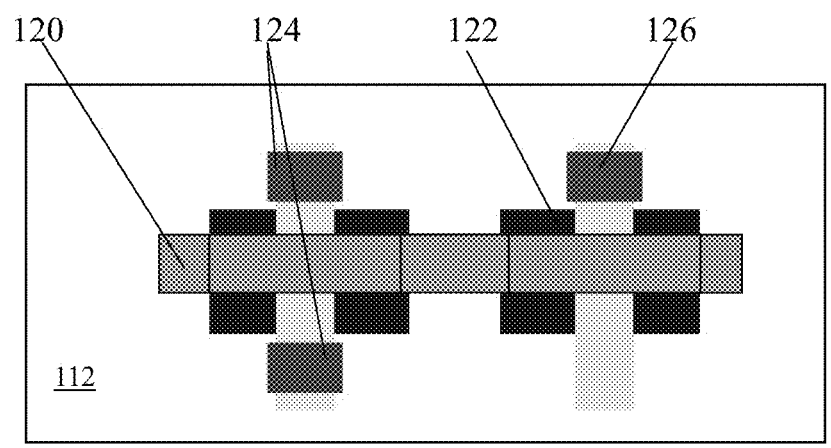

Next, optionally, a metal silicide layer (for example, NiSi) is respectively formed at the contact part of the source/drain regions of the first fin 114 and at the contact part of the gate of the second fin 116 by a conventional technique, a stress layer (for example, a nitride stress layer) is formed on the device, and a metal contact is formed on the metal silicide layer, wherein a source/drain contact 124 and a gate contact 126 are respectively shown in FIG. 9 (top view), and the stress layer is not shown in the figure.

In the present invention, a FinFET device is used as a flash memory device, wherein the first fin functions as a flash memory channel, the second fin functions as a control gate, and the polysilicon layer or the metal layer across the first fin and the second fin functions as a floating gate. The process of the FinFET flash memory device is completely compatible with that of the FinFET logical device, which achieves reduction of manufacturing cost.

Although the present invention has been disclosed above with reference to preferred embodiments thereof, it is not intended to limit the invention. Those skilled in the art can modify and vary the embodiments without departing from the spirit and scope of the present invention. Accordingly, any simply, alternations, changes and modification to the embodiments according to technical substances of this invention shall fall within the scope of the appended claims.

Embodiments described in the specification of the present invention are presented in a progressive manner. The description to an embodiment is focused on its difference with other embodiments. The same or similar parts between these embodiments may be referred to each other. Description to the embodiment disclosed above enables those skilled in this art to use or achieve the present invention. Various modifications to the present invention are apparent for those skilled in the art. General theories defined in an embodiment can also be achieved in other embodiments without departing from the scope and spirit of the present invention. Accordingly, the present invention will not be limited by the disclosed embodiments, but may be applied as widely as possible.

What is claimed is:

1. A flash memory device, which is located on an insulating layer, comprising:
    a first fin and a second fin, wherein the second fin is a control gate of the flash memory device, and the first fin is a flash memory channel;
    a gate dielectric layer located on sidewalls and on top of the first fin and the second fin;
    a floating gate located on the gate dielectric layer and across the first fin and the second fin;
    source/drain regions within the first fin which are located on two sides of the floating gate;
    source and drain contacts located on a contact part of the first fin;
    one gate contact located on a contact part of the second fin; and
    wherein there is only one contact which contacts the second fin.

2. The flash memory device according to claim 1, further comprising spacers formed on the two sides of the floating gate.

3. The flash memory device according to claim 2, wherein the insulating layer is an insulating layer of a Semiconductor On Insulator (SOI) substrate, and the first fin and the second fin are formed by a top semiconductor layer of the SOI substrate.

4. The flash memory device according to claim 1, wherein the second fin is n-type or p-type doped.

5. The flash memory device according to claim 4, wherein the insulating layer is an insulating layer of a Semiconductor On Insulator (SOI) substrate, and the first fin and the second fin are formed by a top semiconductor layer of the SOI substrate.

6. The flash memory device according to claim 1, wherein the floating gate is a polysilicon gate or a metal gate.

7. The flash memory device according to claim 6, wherein the insulating layer is an insulating layer of a Semiconductor On Insulator (SOI) substrate, and the first fin and the second fin are formed by a top semiconductor layer of the SOI substrate.

8. The flash memory device according to claim 1, wherein a protective cap layer is formed on top of the first fin and the second fin.

9. The flash memory device according to claim 8, wherein the insulating layer is an insulating layer of a Semiconductor On Insulator (SOI) substrate, and the first fin and the second fin are formed by a top semiconductor layer of the SOI substrate.

10. The flash memory device according to claim 1, wherein the first fin and the second fin are arranged in parallel on the insulating layer.

11. The flash memory device according to claim 10, wherein the insulating layer is an insulating layer of a Semiconductor On Insulator (SOI) substrate, and the first fin and the second fin are formed by a top semiconductor layer of the SOI substrate.

12. The flash memory device according to claim 1, wherein the insulating layer is an insulating layer of a Semiconductor On Insulator (SOI) substrate, and the first fin and the second fin are formed by a top semiconductor layer of the SOI substrate.

13. The flash memory device according to claim 1, further comprising a stress layer formed adjacent the source and drain contacts.

* * * * *